United States Patent [19]

Boisvert

[11] Patent Number: 5,973,540
[45] Date of Patent: Oct. 26, 1999

[54] LADDER TRACKING BUFFER AMPLIFIER

[75] Inventor: David M. Boisvert, Windham, N.H.

[73] Assignee: National Semiconductor Corporation, Santa Clara, Calif.

[21] Appl. No.: 09/012,774

[22] Filed: Jan. 23, 1998

[51] Int. Cl.$^6$ ..................................................... G06G 7/12
[52] U.S. Cl. ........................... 327/362; 327/538; 327/317
[58] Field of Search .................................... 323/315, 316; 327/362, 513, 517, 538, 317, 108, 540

[56] References Cited

U.S. PATENT DOCUMENTS

| | | | |
|---|---|---|---|
| 4,777,392 | 10/1988 | Maloberti et al. | 327/317 |
| 5,637,992 | 6/1997 | Edwards | 323/315 |
| 5,701,097 | 12/1997 | Fisher et al. | 327/538 |
| 5,874,827 | 2/1999 | Hashimoto | 323/316 |

OTHER PUBLICATIONS

Session XV: A/D Conversion, "A 10b 20MH$_z$ Two–Step Parallel ADC With Internal S/H", Toshihiko Shimizu, et al., ISSCC 88, Feb. 19, 1988, Digest of Technical Papers, pp. 224–225.

Session 2: Data Conversion, "A 10b 50MS/s Pipelined ADC" Pieter Vorenkamp, et al., ISSCC 92, 1992 IEEE International Solid–State Circuits Conference, pp. 32–33.

"An 8–bit Video ADC Incorporating Folding and Interpolation Techniques", Rob E.J. Van De Grift, et al., IEEE Journal of Solid–State Circuits, vol. SC–22, No. 6, Dec. 1987, pp. 944–953.

*Primary Examiner*—Toan Tran
*Attorney, Agent, or Firm*—Skjerven,Morrill,MacPherson, Franklin and Friel; Edward C. Kwok

[57] ABSTRACT

A structure and a method are provided to receive a high-impedance reference voltage signal and generate a desired output signal that is capable of sourcing enough current to meet the demands of a fixed-resistance load. In such a circuit, the signal from an accurate, wide output-swing voltage source circuit having low quiescent current is combined with the output of a current source circuit so that the voltage input to the load is maintained even as the necessary current is supplied. The current source circuit preferably includes a tracking resistance that sinks a control current which a current mirror multiplies by the same ratio as that between the tracking resistance and the load resistance. In addition, it is preferable for the tracking resistance to be large compared to the load resistance, in order to minimize quiescent current draw, and also for the tracking resistors to be created and located at the same time and place as the load resistance, to minimize the effects of sheet resistance variations and temperature changes.

10 Claims, 3 Drawing Sheets

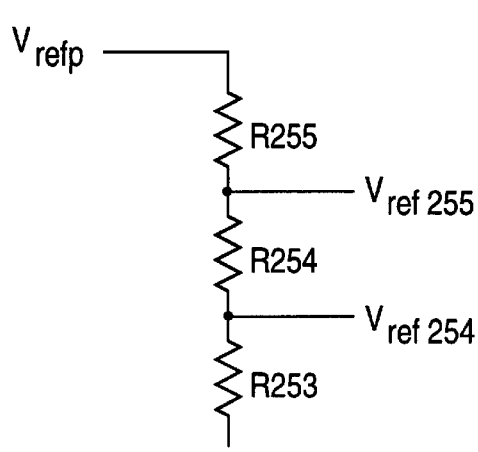
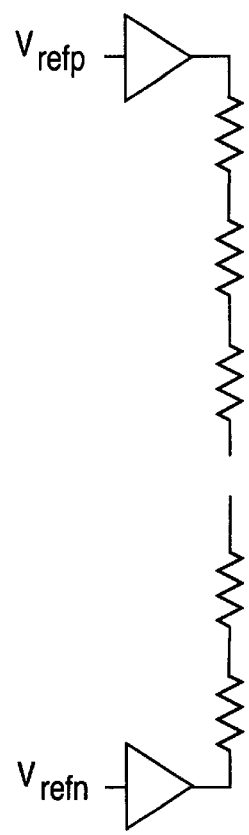
FIG. 1a
(PRIOR ART)
FIG. 1b
(PRIOR ART)
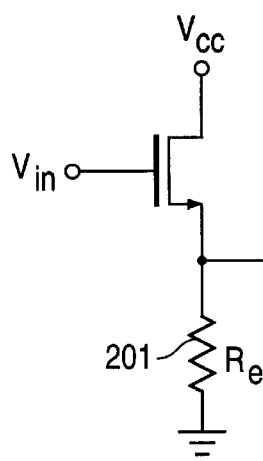
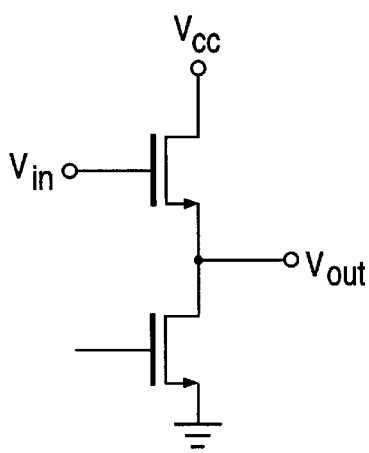
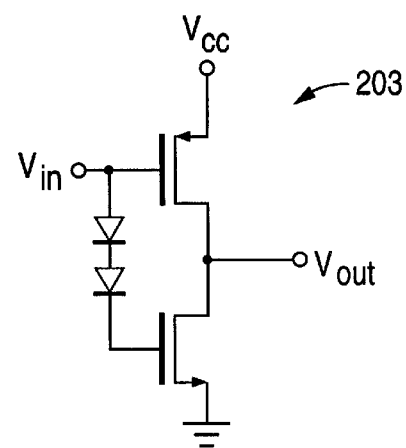
FIG. 2a
(PRIOR ART)
FIG. 2b
(PRIOR ART)
FIG. 2c
(PRIOR ART)

LADDER TRACKING BUFFER AMPLIFIER

BACKGROUND OF THE INVENTION

1. Field of the Invention

The present invention relates to electronic amplification circuits, and in particular, to an efficient, accurate, wide-output, low-power amplifier for driving loads with known resistance.

2. Discussion of the Related Art

In an integrated circuit, a reference voltage signal is often needed. This signal is typically high impedance and cannot source any significant amount of current, which means that the signal cannot be directly connected to a low-impedance input terminal. Therefore it is desirable to provide an intermediate circuit, or buffer, that receives the reference voltage as input and provides the necessary current at the reference voltage. One application of a reference voltage can be found in an analog-to-digital converter (ADC), which converts an analog input voltage to a digital output code. In many monolithic implementations, an ADC is achieved by comparing the analog input voltage to a series of reference voltages. These reference voltages are often generated by applying a reference voltage difference across a string of serially connected resistors, called a resistor ladder, as shown in FIG. 1a. In the figure shown, there are 256 serially connected resistors, each of resistance Rref, and the reference voltage difference applied across the resistor ladder is Vrefp minus Vrefn (often, Vrefn is simply at ground). Clearly, any change in Vrefp or Vrefn will change the values of voltage reference values Vref0 through Vref255. In general, because of the need to maintain stable voltage reference values, the total resistance of the ladder is low (e.g., 100–1000 Ω) and the reference voltage difference is large (e.g., 1–4 V). Typically, the sources of reference voltage inputs Vrefp and Vrefn are unable to source high currents, so it is common for on-chip voltage buffers to be used as intermediate circuits to provide the current in the resistor ladder, as shown in FIG. 1b. An ideal buffer would possess the following characteristics:

(a) Accurate voltage output (e.g., Voffset<5 mV)

Because the output of the buffer is intended to provide a reference voltage for other measurements, it is critical that the buffer input is accurately represented at the buffer output.

(b) Wide range of output currents (e.g., 1–25 mA)

In general, a load such as a resistor ladder will require as input a constant reference voltage. Because of thermal effects, the current demand of the load will change during normal operation. In addition, manufacturing process variations can lead to varying ladder resistance and, as a result, varying current supply requirements. Finally, different applications will generally involve changing reference voltage differences. Therefore, the buffer must be able to source a range of currents.

(c) Wide supply voltage range (e.g., 2.7–5.5 V)

In order to maintain functionality in a variety of situations, the buffer should be able to operate off a significant range of supply voltages.

(d) Wide output voltage range (e.g., rail-to-rail)

Because of (c), it is important to make the most use of whatever reference voltage is provided. A rail-to-rail output capability maximizes the allowable buffer output voltage range for a given reference input voltage.

(e) Low quiescent current (e.g., <500 mA)

Quiescent current is a current that is used by the circuit independent of the current used by the load itself. An increase in quiescent current translates directly into additional power required by the circuit.

A buffer can be implemented, for example, by an operational amplifier (op-amp) or any circuit providing a high-impedance input and accurate low-impedance output. Likewise, any such stand-alone buffer could be incorporated as the output stage of an op-amp, with standard input and gain stages making up the rest of the op-amp. In a conventional buffer, performance depends on a number of parameters. For instance, a common buffer circuit is the "source follower", in which a signal is fed into the gate of a transistor, and the output is taken from the source, as shown in FIG. 2a. This configuration can supply a wide output current range, but has a limited output voltage swing due to the unavoidable voltage drop between the gate and source. In addition, to ensure that the circuit remains a low-impedance source, resistor Re must be low resistance, which increases the quiescent current draw for any given supply voltage, and correspondingly, the power used by the circuit. This quiescent current draw can be minimized by replacing the fixed resistor Re with an active current sink, as shown in FIG. 2b. However, the improved power efficiency comes with a further reduction in output voltage swing, as the current sink starts to shut down at 0.2–0.3 V. Taking a different approach, circuit 203 in FIG. 2c depicts a type of output stage used in complimentary-output-stage op-amps such as the LMC660 (CMOS) or the LM10 (bipolar), both from National Semiconductor. Since the transistors behave like a small resistance when saturated, the output actually is able to swing from rail to rail. However, this configuration produces a high-impedance output stage, so the load current demand can overwhelm the current supply capability, and even small changes in the current draw cause output voltage fluctuations.

Accordingly, it is desirable to provide a buffer that is capable of accurate, low impedance, rail-to-rail output voltage swing, over a wide range of output current.

SUMMARY OF THE INVENTION

The present invention provides a circuit for a voltage buffer output stage that consumes low power but produces a stable, accurate, high-current, wide voltage output swing. According to the present invention, the output stage circuit includes:

(1) a voltage generator that produces an accurate rail-to-rail output voltage swing while consuming low quiescent current; and (2) a current generator that includes:

(2a) a current simulator that sinks a control current based on the current required by a load resistance, while at the same time consuming low quiescent current; and (2b) a current mirror that responds to the control current in (2a) and sources a reference current to satisfy the demands of the load.

The output terminals of the voltage generator and the current generator are combined, producing a low-impedance, high current source. Inspection of this combination reveals a number of key benefits. Now, because the current mirror provides the necessary current to maintain the reference voltage at the ladder, the wide-swing, high-accuracy circuit in FIG. 2c can be used in the voltage generator. In addition, the current generator can be configured to provide just the right amount of current, minimizing power dissipation while still ensuring voltage stability. Furthermore, the current mirror output operates rail-to-rail and does not limit the output voltage swing. The use of a tracking resistor or resistors in the current simulator to determine the control current renders some additional benefits. Due to the nature of semiconductor circuit manufacturing, if all tracking resistors are created at the same time and at the same location as the load resistors, they can be accurately matched to one another. Then, resistance value differences due to manufacturing variations in sheet resistance are minimized, and the circuit will automatically compensate for temperature effects on resistance during normal operation. Also, the value of the tracking resistor can be made to be a large multiple of the load resistance, reducing the amount of control current, equivalent to the quiescent current, drawn by the current generator.

This invention will be more fully understood after consideration of the following detailed description taken along with the accompanying drawings.

BRIEF DESCRIPTION OF THE DRAWINGS

FIG. 1a is a schematic circuit diagram of a resistance ladder commonly used in ADC's;

FIG. 1b is a schematic circuit diagram of an ADC resistance ladder with buffer inputs;

FIG. 2a is a schematic circuit diagram of a typical source follower;

FIG. 2b is a schematic circuit diagram of a source follower with an active load;

FIG. 2c is a schematic circuit diagram of a common complimentary-output-stage that provides wide output voltage swing;

Use of the same reference numbers in different figures indicates similar or like elements.

DETAILED DESCRIPTION

Although this present invention is illustrated by way of example in this detailed description using MOS devices, it will be appreciated that the present invention is applicable generally to implementation in all types of integrated circuit (IC) devices. For example, the described circuits can be implemented equally successfully with corresponding bipolar devices.

Figure 3:
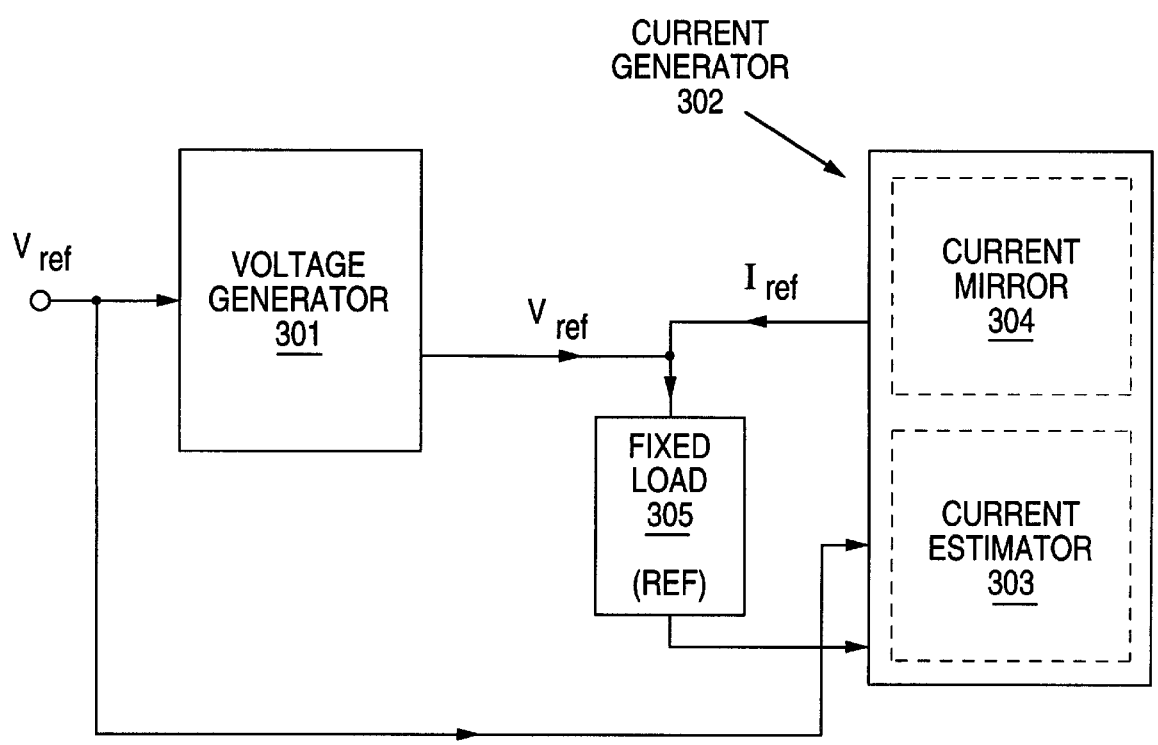
FIG. 3 is a block diagram of the present invention.

The present invention provides accurate input voltage amplification and efficient high-current sourcing capability. The present invention is illustrated in FIG. 3, which shows a voltage generator 301, and a current generator 302, which includes a current estimator 303 and a current mirror 304. These components are nominally intended to be incorporated in the output stage of an operational amplifier (op-amp), but could just as well be used as a separate circuit. Although not a part of the present invention, a fixed load 305 is shown for explanatory purposes.

Figure 4:
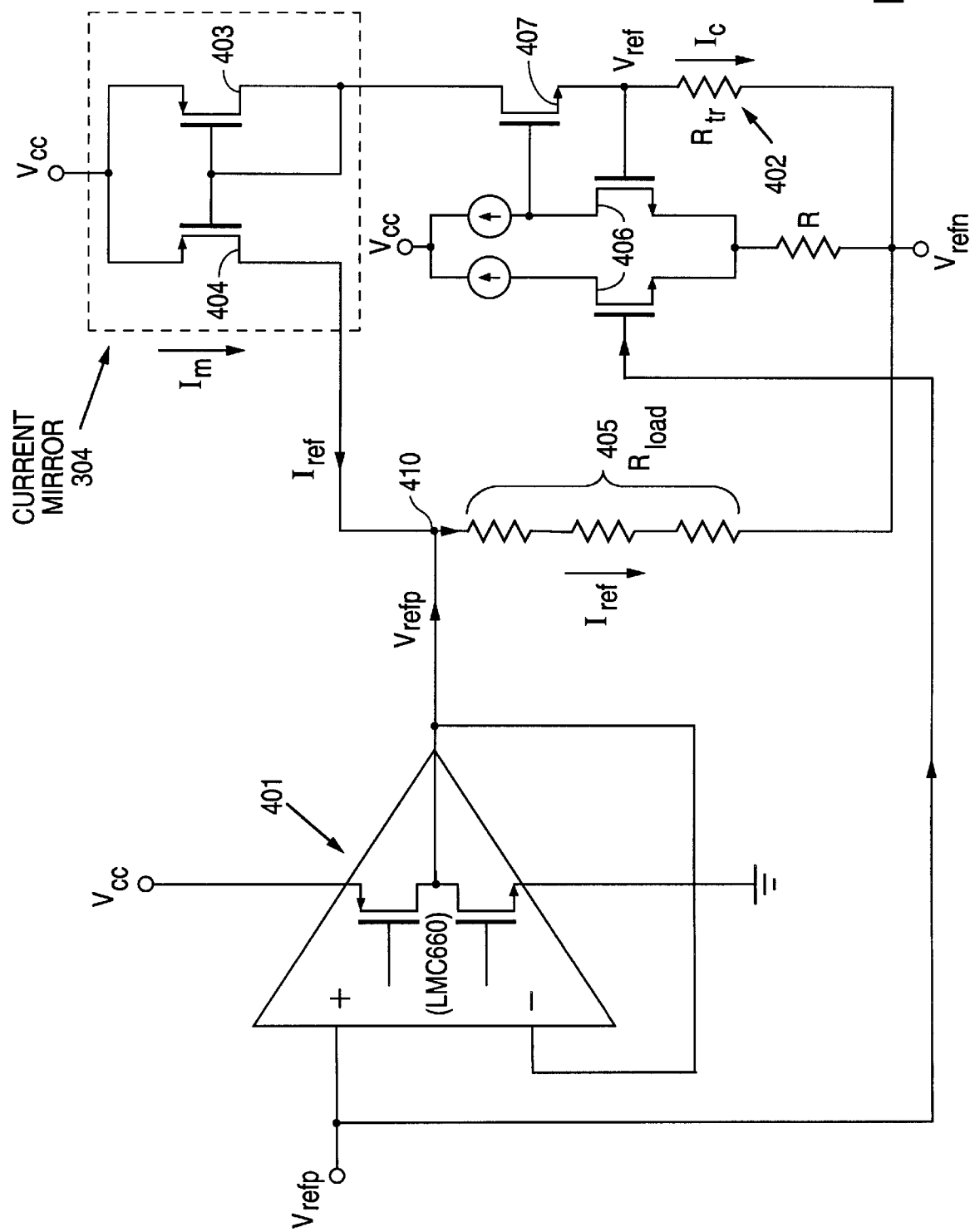
FIG. 4 is a schematic circuit diagram of an embodiment of the present invention.

One implementation of the circuit of FIG. 3 is shown in FIG. 4. Voltage generator 301 includes an op-amp 401, such as the well-known op-amp LMC660 from National Semiconductor Corporation, which utilizes output stage 203 shown in FIG. 2c. Therefore, by configuring op-amp 401 as a follower as shown in FIG. 4, a unity voltage gain with full rail-to-rail output voltage swing is enabled. In FIG. 4, fixed load 305 is depicted as a resistor ladder 405 having a load resistance Rload. Current generator 302 contains a tracking resistor 402 of a tracking resistance Rtr. Tracking resistance Rtr is a multiple of load resistance Rload, and is given by $$Rtr = N*Rload \qquad (1)$$

where N is a predefined positive constant. In this implementation, tracking resistor 402 is made out of the same material and at the same location as the reference resistors in ladder 405 so that any temperature or process variables that affect the ladder resistance similarly affect tracking resistance Rtr. Differential pair 406 provides a high-impedance input for a reference voltage Vrefp, and applies the voltage difference between voltage Vrefp and a reference voltage Vrefn across tracking resistor 402, causing a current Ic to be sourced by transistor 407. Current Ic is defined by $$Ic = (Vrefp - Vrefn)/Rtr \qquad (2)$$

Quiescent current draw is minimized by making tracking resistance Rtr large. The embodiment of current mirror 304 shown in FIG. 4 sinks control current Ic from the drain of a transistor 403. The gate-source voltage of transistor 403 is applied to a matched transistor 404, sourcing a mirror current Iref from matched transistor 404. The widths of transistors 403 and 404 are sized such that the ratio of mirror current Iref to control current Ic is inversely proportional to the ratio between load resistance Rload and tracking resistance Rtr. This ratio of mirror current Iref to control current Ic, or magnification factor, can also be adjusted by adding additional transistors in parallel with transistor 404. The magnification factor MF is given by $$MF = Rtr / Rload \qquad (3)$$
$$= N * Rload / Rload \qquad [\text{substitute (1)}]$$
$$MF = N$$

At junction 410, high output impedance op-amp 401 provides Vrefp to reference ladder 405. The current required by load resistance Rload is a current Ireq, which is defined by Ohm's Law to be $$Ireq = (Vrefp - Vrefn)/Rload \qquad (4)$$

Because load resistance Rload is small, current Ireq is greater than the amount of current op-amp 401 would be able to source. Without the current from transistor 404, the output voltage of op-amp 401 would be driven below Vrefp, leading to deviations in the reference voltages. However, mirror current Iref is also applied to reference ladder 405. The magnitude of mirror current Iref is $$Iref = MF * Ic \qquad (5)$$
$$= N * Ic \qquad [\text{substitute (3)}]$$
$$= N * (Vrefp - Vrefn) / Rtr \qquad [\text{sub. (2)}]$$
$$= N * (Vrefp - Vrefn) / (N * Rload) \qquad [\text{sub. (1)}]$$
$$Iref = (Vrefp - Vrefn) / Rload$$

Therefore, $$Iref = Ireq \qquad [\text{combine (4)\&(5)}]$$

Thus, through proper sizing of the magnification factor of current mirror 304 and the tracking resistance Rtr of tracking resistor 402, the current that op-amp 401 would otherwise have to source to properly drive resistor ladder 405 is provided by current mirror 304. Current generator 302 detects any changes in voltage Vrefp, voltage Vrefn, or load resistance Rload, an adjusts its output to provide the required current. At the same time, since transistor 404 provides a high impedance output, it does not affect the voltage output Vrefp from op-amp 401. In addition, the large resistance of tracking resistor 402 minimizes quiescent current draw. Therefore, combining the accurate, wide output voltage op-amp 401 with the high-current sourcing, low power draw current mirror 304 provides an ideal buffer amplifier for resistor ladder 405.

The above-described embodiments of the present invention are merely meant to be illustrative of the present invention and not intended to be limiting. It will thus be apparent to those skilled in the art, upon consideration of the above detailed description and drawings, that various changes and modifications may be made within the scope of the present invention. For example, the current mirror can be implemented as a Wilson current mirror in order to improve stability with load variations. Therefore, the appended claims encompass all such changes and modifications as fall within the scope of this invention.

I claim:

1. In an integrated circuit, an amplification circuit comprising:

(a) a voltage generator which contains voltage generating means having an input for receiving a reference voltage signal, and to generate a voltage output having a desired ratio to said reference voltage signal; and (b) a current generator which contains current generating means responsive to said reference voltage signal to supply a source current required by a load having a load resistance, said voltage output and said source current being concurrently supplied to said load.

2. The amplification circuit of claim 1 wherein said current generating means comprises:

(a) a current estimating means responsive to said reference voltage signal to determine said source current requirement for said load; and (b) a current sourcing means to source said source current.

3. The amplification circuit of claim 2 wherein:

(a) said current estimating means includes a tracking resistance comprising at least one tracking resistor, said tracking resistance having a known relationship to said load resistance; and (b) said current sourcing means includes a current mirror circuit which tracks a control current in said tracking resistor and sources said source current wherein said source current is proportional to said control current in substantially the same ratio as said tracking resistance to said load resistance.

4. The amplification circuit of claim 3 wherein said tracking resistors are physically located in close proximity to said load resistance.

5. The amplification circuit of claim 3 wherein said tracking resistance is substantially greater than said load resistance.

6. A method for providing a low-impedance reference voltage signal to a load, comprising the steps of:

(a) receiving an input reference voltage;

(b) providing an output voltage signal having a desired ratio to said input reference voltage;

(c) sourcing an output current that satisfies a load current requirement of said load in response to said reference voltage signal has been inserted, and (d) applying in combination said output voltage signal and said output current to said load.

7. The method of claim 6, wherein said sourcing step comprises the steps of:

(a) estimating said load current required by said load in response to said reference voltage signal;

(b) creating a signal that indicates the value of said load current;

(c) reading said signal; and (d) sourcing said output current which substantially approximates said load current.

8. The method of claim 7, wherein:

(a) said estimating and creating steps are performed using a tracking resistance comprised of at least one tracking resistor, the value of said tracking resistance having a known relationship to said load; and (b) said reading and sourcing steps are performed using a current mirror, where the amplification factor of said current mirror is the same as said relationship of said tracking resistance to said load.

9. The method of claim 8 wherein all said tracking resistors are created and located in approximately the same location as said load.

10. The method of claim 8 wherein the value of said tracking resistance is substantially greater than the value of said load.

\* \* \* \* \*